US012660576B2

(12) United States Patent
Seo et al.

(10) Patent No.: US 12,660,576 B2
(45) Date of Patent: Jun. 16, 2026

(54) APPARATUS AND METHOD OF MEASURING AIR CURRENTS ON SURFACE OF SUBSTRATE

(71) Applicant: SEMES CO., LTD., Chungcheongnam-do (KR)

(72) Inventors: Yong Jun Seo, Gyeonggi-do (KR); Su Jin Chae, Gyeonggi-do (KR); Sang Hyun Son, Busan (KR); Sang Min Ha, Gyeonggi-do (KR); Young Sik Bang, Gyeonggi-do (KR); Jeong Mo Hwang, Gyeonggi-do (KR); Dong Ok Ahn, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 428 days.

(21) Appl. No.: 18/382,042

(22) Filed: Oct. 19, 2023

(65) Prior Publication Data

US 2024/0153831 A1 May 9, 2024

(30) Foreign Application Priority Data

Nov. 3, 2022 (KR) ......................... 10-2022-0145188

(51) Int. Cl.
*G01F 1/684* (2006.01)
*G01F 1/688* (2006.01)
(Continued)

(52) U.S. Cl.
CPC .......... *H10P 74/277* (2026.01); *G01F 1/6845* (2013.01); *G01F 1/6888* (2013.01); *G01F 1/6965* (2013.01)

(58) Field of Classification Search
USPC ...................................................... 73/204.18
See application file for complete search history.

(56) References Cited

FOREIGN PATENT DOCUMENTS

JP           2001-12985           1/2001
JP           2001129850  A  *  5/2001
(Continued)

OTHER PUBLICATIONS

Office Action dated Nov. 15, 2024 for Korean Patent Application No. 10-2022-0145188 and its English translation from Global Dossier.

*Primary Examiner* — Walter L Lindsay, Jr.
*Assistant Examiner* — Warren K Fenwick
(74) *Attorney, Agent, or Firm* — WOMBLE BOND DICKINSON (US) LLP

(57) ABSTRACT

An apparatus and method for measuring air currents on the surface of a substrate, which can accurately measure the magnitude and direction of air currents on the surface of a wafer with wafer-type air current measurement sensors, are provided. The apparatus includes: a first air current measurement module measuring a magnitude of air currents on a surface of a first substrate, which is processed in accordance with a semiconductor manufacturing process; a second air current measurement module measuring a movement direction of the air currents; and a power module supplying power to the first and second air current measurement modules, wherein the first air current measurement module, the second air current measurement module, and the power module are mounted on a second substrate, which has the same shape as the first substrate.

20 Claims, 16 Drawing Sheets

100

110

FIRST AIR CURRENT MEASUREMENT MODULE

140

MAIN CONTROL MODULE

130

POWER MODULE

120

SECOND AIR CURRENT MEASUREMENT MODULE

(51) Int. Cl.
G01F 1/696 (2006.01)
H10P 74/00 (2026.01)

(56) References Cited

FOREIGN PATENT DOCUMENTS

| KR | 10-2014-0000147 | | | 1/2014 | | |
| KR | 20140000147 | A | * | 1/2014 | ............. | H01L 22/30 |
| KR | 10-2015-0125870 | | | 11/2015 | | |
| KR | 20150125870 | A | * | 11/2015 | ........... | G02F 1/1303 |
| KR | 10-2022-0041300 | | | 4/2022 | | |
| KR | 20220041360 | A | * | 4/2022 | ........... | B65B 25/146 |
| KR | 10-2022-0094754 | | | 7/2022 | | |
| KR | 20220094754 | A | * | 7/2022 | ....... | H01L 21/67103 |
| KR | 20220145188 | A | * | 10/2022 | ............. | G10L 25/48 |

* cited by examiner

APPARATUS AND METHOD OF MEASURING AIR CURRENTS ON SURFACE OF SUBSTRATE

CROSS-REFERENCE TO RELATED APPLICATION

This application claims priority from Korean Patent Application No. 10-2022-0145188 filed on Nov. 3, 2023 in the Korean Intellectual Property Office, and all the benefits accruing therefrom under 35 U.S.C. 119, the contents of which in its entirety are herein incorporated by reference.

BACKGROUND

1. Field

The present disclosure relates to an apparatus and method for measuring air currents on the surface of a substrate, and more particularly, to an apparatus and method for measuring the magnitude and direction of air currents on the surface of a substrate.

2. Description of the Related Art

Semiconductor manufacturing processes may be performed continuously within semiconductor manufacturing equipment and may be divided into front-end and back-end processes. The front-end process refers to the process of forming circuit patterns on a wafer to complete semiconductor chips, while the back-end process refers to the process of evaluating the performance of the finished products from the front-end process.

Semiconductor manufacturing equipment may be installed within semiconductor fabrication facilities, known as "fabs," to manufacture semiconductors. Wafers may be moved through transfer modules to undergo various processes such as deposition, photolithography, etching, polishing, ion implantation, cleaning, packaging, and testing, each required for semiconductor production.

In semiconductor manufacturing processes, the direction and speed of air currents are closely related to particles and surface stabilization temperature. Therefore, measuring air currents that affect wafers is crucial to maintaining a consistent semiconductor manufacturing environment.

However, traditional methods lack devices or techniques to directly measure air currents on the surface of a wafer. As a result, commercial anemometers are often installed within the equipment using jigs, and the air currents inside the equipment are estimated using these commercial anemometers.

However, this approach may act as an obstacle, affecting the direction and speed of the air currents on the surface of the wafer due to the structures of the anemometers and the jigs. Additionally, measurement errors may occur depending on the distance between the anemometers and the wafer.

SUMMARY

Aspects of the present disclosure provide an apparatus and method for measuring air currents on the surface of a substrate, which can accurately measure the magnitude and direction of air currents on the surface of a wafer with wafer-type air current measurement sensors.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, an apparatus for measuring air currents on a surface of a substrate includes: a first air current measurement module measuring a magnitude of air currents on a surface of a first substrate, which is processed in accordance with a semiconductor manufacturing process; a second air current measurement module measuring a movement direction of the air currents; and a power module supplying power to the first and second air current measurement modules, wherein the apparatus further comprises at least one of a memory module, which stores measurement results regarding the air currents, and a communication module, which transmits the measurement results regarding the air currents to outside, and the first air current measurement module, the second air current measurement module, the power module, the memory module, and the communication module are mounted on a second substrate, which has the same shape as the first substrate.

According to another aspect of the present disclosure, an apparatus for measuring air currents on a surface of a substrate includes: a first air current measurement module measuring a magnitude of air currents on a surface of a first substrate, which is processed in accordance with a semiconductor manufacturing process; a second air current measurement module measuring a movement direction of the air currents; and a power module supplying power to the first and second air current measurement modules, wherein the apparatus further comprises at least one of a memory module, which stores measurement results regarding the air currents, and a communication module, which transmits the measurement results regarding the air currents to outside, the first air current measurement module, the second air current measurement module, the power module, the memory module, and the communication module are mounted on a second substrate, which has the same shape as the first substrate, the second air current measurement module calculates the movement direction of the air currents using multiple first air current measurement modules, the first air current measurement module is disposed at a top of the second substrate, the second air current measurement module, the power module, the memory module, and the communication module are disposed at a bottom of the second substrate, the first air current measurement module is a thermal transducer, the first air current measurement module is formed on a surface of the second substrate as a thin film pattern or as a micro-electro mechanical system (MEMS) pattern, the first air current measurement module is disposed in a hole formed in the second substrate, the second air current measurement module, the power module, the memory module, and the communication module are embedded at the bottom of the second substrate or are installed on a third substrate, which is coupled to the bottom of the second substrate, and the apparatus is fastened within a first substrate processing device performing a cleaning process on the first substrate or within a second substrate processing device performing a heat treatment process on the first substrate, using multiple edge rings, which are installed at the bottom of the second substrate.

According to another aspect of the present disclosure, a method of measuring air currents on a surface of a substrate includes: placing an apparatus for measuring air currents on a surface of a substrate at a location where a first substrate is positioned within a substrate processing device, which processes the first substrate in accordance with a semiconductor manufacturing process; operating the apparatus and creating the same environment as when processing the first substrate within the substrate processing device; measuring a magnitude and movement direction of air currents using the apparatus; storing measurement results regarding the air currents; and transmitting the measurement results regarding the air currents to a designated terminal, wherein the apparatus is installed on a second substrate, which has the same shape as the first substrate.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
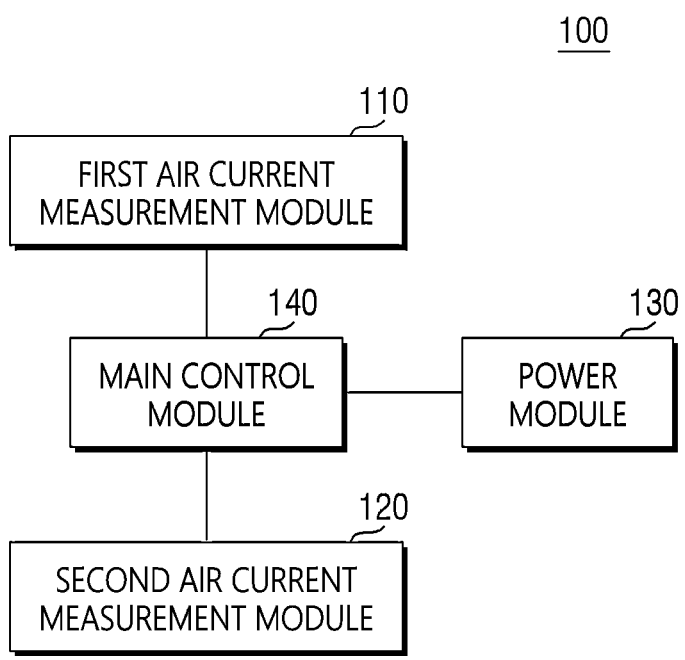
FIG. 1 is a block diagram illustrating the internal configuration of an apparatus for measuring air currents on the surface of a substrate.

Embodiments of the present disclosure will hereinafter be described with reference to the accompanying drawings. Like reference numerals indicate like elements throughout the present disclosure, and thus, redundant descriptions thereof will be omitted.

The present disclosure pertains to an apparatus and method for measuring air currents on the surface of a substrate.

FIG. 1 is a block diagram illustrating the internal configuration of an apparatus for measuring air currents on the surface of a substrate.

Referring to FIG. 1, an apparatus 100 (hereinafter, the air current measurement apparatus 100) for measuring air currents on the surface of a substrate may be configured to include a first air current measurement module 110, a second air current measurement module 120, a power module 130, and a main control module 140.

The first and second air current measurement modules 110 and 120 may serve to monitor the movement of air currents on the surface of a substrate. The first air current measurement module 110 may measure the magnitude of the air currents, while the second air current measurement module 120 may measure the movement direction of the air currents.

The first air current measurement module 110 may be provided in multiple units to measure the magnitude of the air currents in different regions of a substrate, but the present disclosure is not limited thereto. Alternatively, the first air current measurement module 110 may be provided in a single unit or in multiple units for each region of the substrate in consideration of any operational faults such as malfunctions or misoperations. The first air current measurement module 110 may be configured with the performance of an anemometer to measure the magnitude of the air currents.

As previously explained, the first air current measurement module 110 may be provided in multiple units for different regions of the substrate. Then, the second air current measurement module 120 may calculate or estimate the movement direction of the air currents based on the air current measurement results obtained from the first air current measurement module 110.

However, the present embodiment is not limited to this. The second air current measurement module 120 may be provided as a separate module to measure the movement direction of the air currents, independently of the first air current measurement module 110.

In this case, the second air flow measurement 120 may also be provided in multiple units for different regions of the substrate. The second air current measurement module 120 may be provided in the same quantity as the first air current measurement module 110, and when the first and second air current measurement modules 110 and 120 are provided in the same quantity, they may be integrated as one set. On the other hand, the second air current measurement module 120 may also be provided in a different quantity from the first air current measurement module 110.

The second air current measurement module 120, like the first air current measurement module 110, may be provided in a single unit or in multiple units for each region of the substrate in consideration of any operational faults such as malfunctions or misoperations. The second air current measurement module 120 may be configured with the performance of an anemometer to measure the movement direction of the air currents.

The power module 130 provides power to each of the components of the air current measurement apparatus 100 (i.e., the first air current measurement module 110, the second air current measurement module 120, the main control module 140, etc.). The power module 130 may supply power to the first and second air current measurement modules 110 and 120 under the control of the main control module 140. The power module 130 may be powered by, for example, a battery.

The main control module 140 controls the overall operation of components of the air current measurement apparatus 100 (i.e., the first air current measurement module 110, the second air current measurement module 120, the main control module 140, etc.). As previously explained, the main control module 140 may control the power module 130 to supply power to the first and second air current measurement modules 110 and the second air current measurement module 120.

The power module 130 may supply power to the first and second air current measurement modules 110 and 120 when monitoring the movement of air currents on the surface of the substrate is necessary. However, in other cases, the power module 130 may not provide power to the first and second air current measurement modules 110 and 120. In this manner, power wastage can be prevented, and the lifespan of the power module 130 can be extended.

Figure 2:
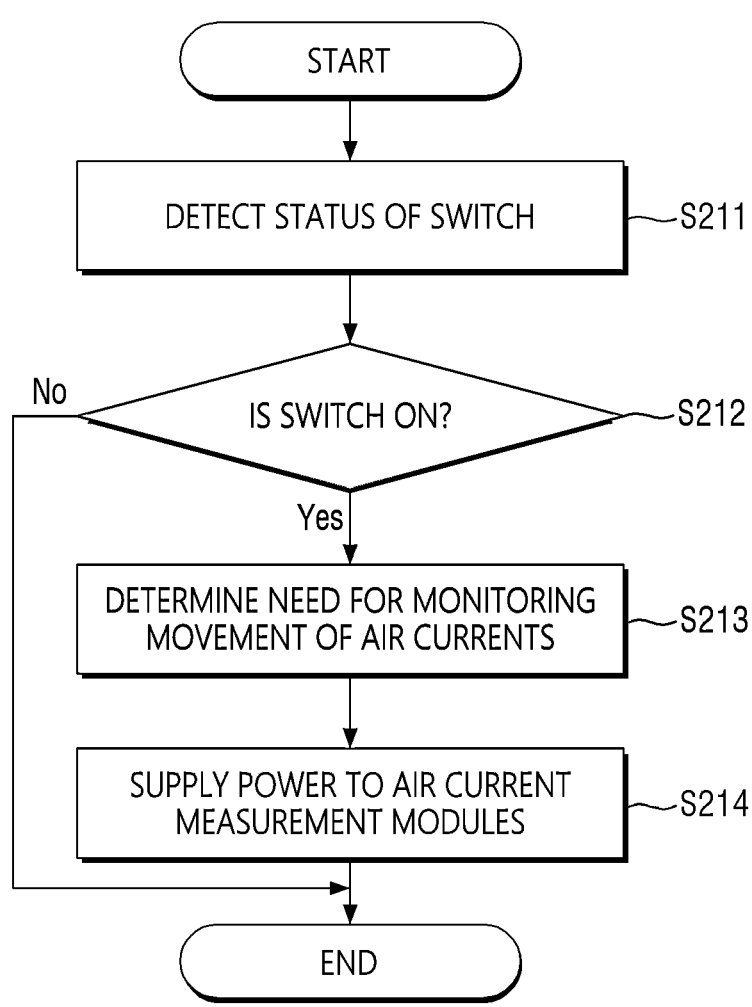
FIG. 2 is a flowchart illustrating an exemplary first-type operation of the apparatus for measuring air currents on the surface of a substrate.

To enable the power module 130 to function as described above, the main control module 140 may determine the necessity of monitoring the movement of air currents on the surface of the substrate. For example, referring to FIG. 2, the main control module 140, which is installed in the air current measurement apparatus 100, may detect the status of an on/off switch (S211). If the on/off switch is turned on ("Yes" in S212), the main control module 140 may determine the need for monitoring air current movement (S213), and may then control the power module 130 to supply power to the first and second air current measurement modules 110 and 120 (S214). FIG. 2 is a flowchart illustrating an exemplary first-type operation of the air current measurement apparatus 100.

Figure 3:
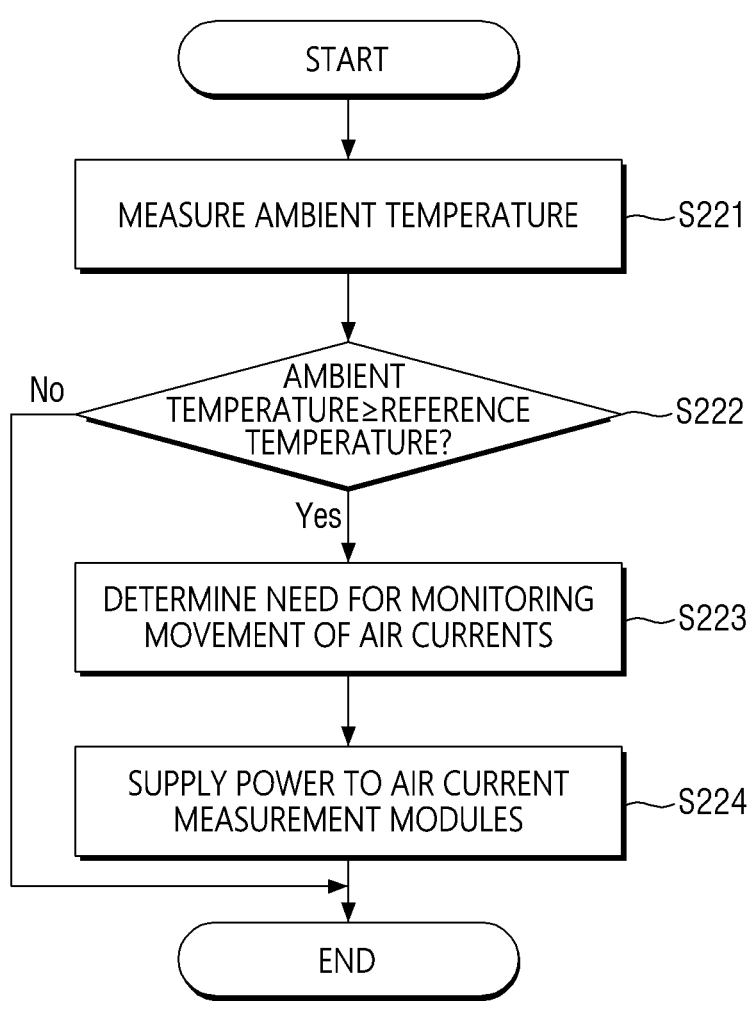
FIG. 3 is a flowchart illustrating an exemplary second-type operation of the apparatus for measuring air currents on the surface of a substrate.

Alternatively, referring to FIG. 3, the main control module 140 may measure the ambient temperature of the air current measurement apparatus 100 (S221) and compare the measured temperature with a reference temperature. If the measured temperature exceeds the reference temperature (S222), the main control module 140 may determine that monitoring air current movement is necessary (S223), and may then control the power module 130 to supply power to the first and second air current measurement modules 110 and 120 (S224). The air current measurement apparatus 100 may include a thermal detector or a temperature measurement sensor to measure the ambient temperature. FIG. 3 is a flowchart illustrating an exemplary second-type operation of the air current measurement apparatus 100.

Figure 4:
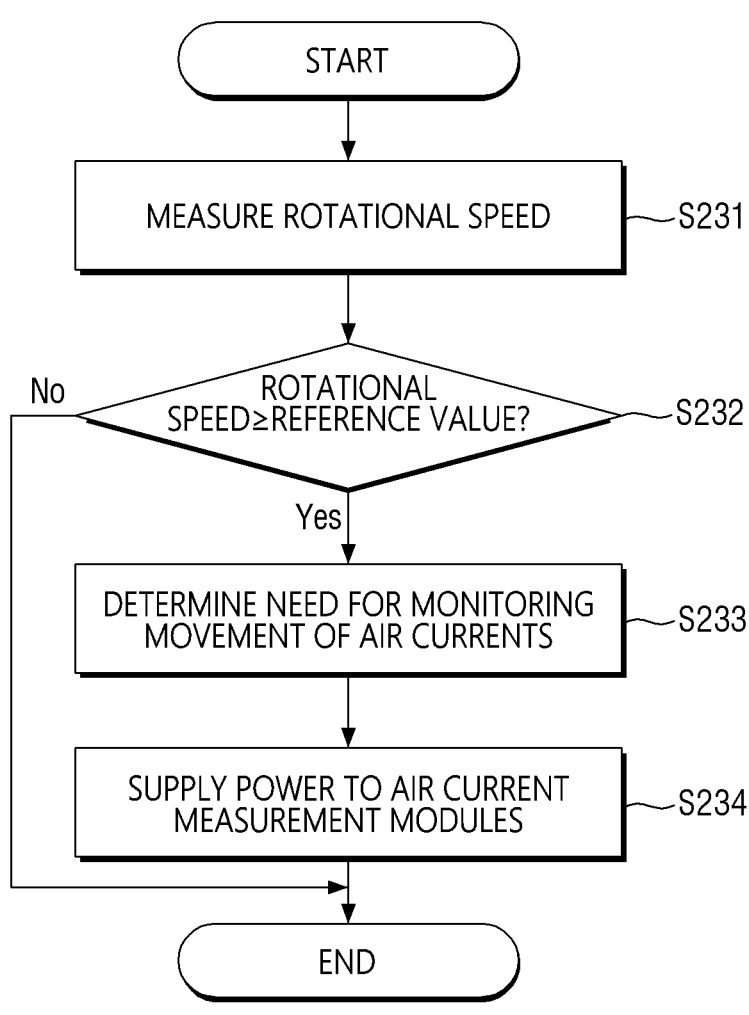
FIG. 4 is a flowchart illustrating an exemplary third-type operation of the apparatus for measuring air currents on the surface of a substrate.

Yet alternatively, referring to FIG. 4, the main control module 140 may measure the rotational speed of the air current measurement apparatus 100 (S231) and compare the measured rotational speed with a reference value. If the measured rotational speed exceeds the reference value (S232), the main control module 140 may determine that monitoring air current movement is necessary (S233) and may then control the power module 130 to supply power to the first and second air current measurement modules 110 and 120 (S234). The air current measurement apparatus 100 may include an angular velocity sensor or any other similar device for rotational speed measurement. FIG. 4 is a flowchart illustrating an exemplary third-type operation of the air current measurement apparatus 100.

The air current measurement apparatus 100 may be installed within semiconductor manufacturing equipment to monitor air current movement on the surface of the substrate. The air current measurement apparatus 100 may be placed at the location where the substrate is positioned within the semiconductor manufacturing equipment during the processing of the substrate. In this case, the substrate may be, for example, a wafer.

The air current measurement apparatus 100 may be applied to a substrate processing system performing a photolithography process on the substrate. For example, the air current measurement apparatus 100 may be applied to a substrate processing system performing a cleaning process, as well as to a substrate processing system performing a heat treatment process.

First, the case where the air current measurement apparatus 100 is applied in a substrate processing system performing a cleaning process will hereinafter be described.

Figure 5:
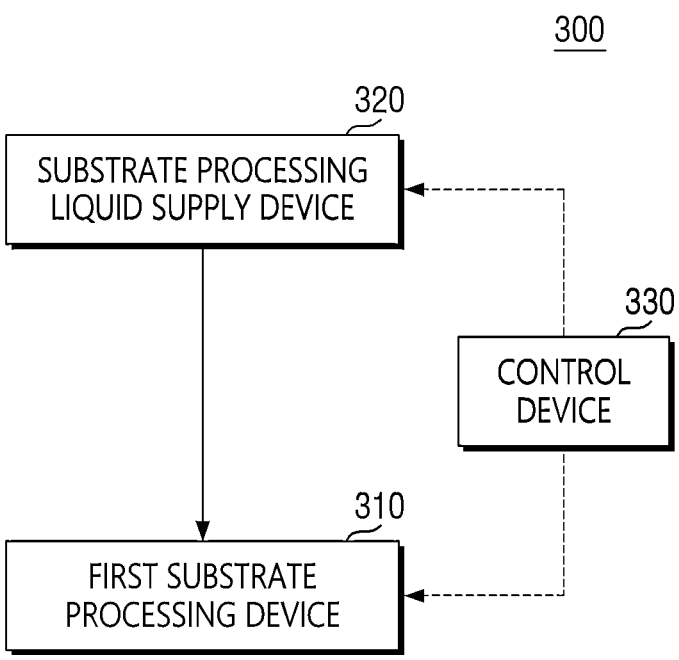
FIG. 5 is a block diagram illustrating the internal configuration of a substrate processing system for use in a cleaning process.

FIG. 5 is a block diagram illustrating the internal configuration of a substrate processing system for use in a cleaning process. Referring to FIG. 5, a substrate processing system 300 may be configured to include a first substrate processing device 310, a substrate processing liquid supply device 320, and a control device 330.

The first substrate processing device 310 processes a substrate using a chemical solution. The first substrate processing device 310 may be provided as a cleaning process chamber that processes the substrate using a chemical solution.

The chemical solution may be in liquid form (e.g., an organic solvent) or in a gaseous form. The chemical solution may include substances that are highly volatile and generate fumes, or have high viscosity and are thus residue-prone. The chemical solution may be selected from among substances containing isopropyl alcohol (IPA), substances containing sulfuric acid (e.g., sulfuric peroxide mixture (SPM) containing sulfuric acid and hydrogen peroxide), substances containing ammonia water (e.g., $H_2O_2 + NH_4OH$ (SC-1)), substances containing hydrofluoric acid (e.g., diluted hydrogen fluoride (DHF), substances containing phosphoric acid, etc. Chemical solutions used to process a substrate will hereinafter be collectively referred to as substrate processing liquids.

When the first substrate processing device 310 is applied to a cleaning process, as described above, the first substrate processing device 310 may rotate the substrate using a spin head and provide the substrate with the substrate processing liquid using nozzles. When the first substrate processing device 310 is configured as a liquid processing chamber, the first substrate processing device 310 may be equipped with a substrate supporting unit 410, a processing liquid recovery unit 420, an elevating unit 430, and an injection unit 440, as illustrated in FIG. 6.

Figure 6:
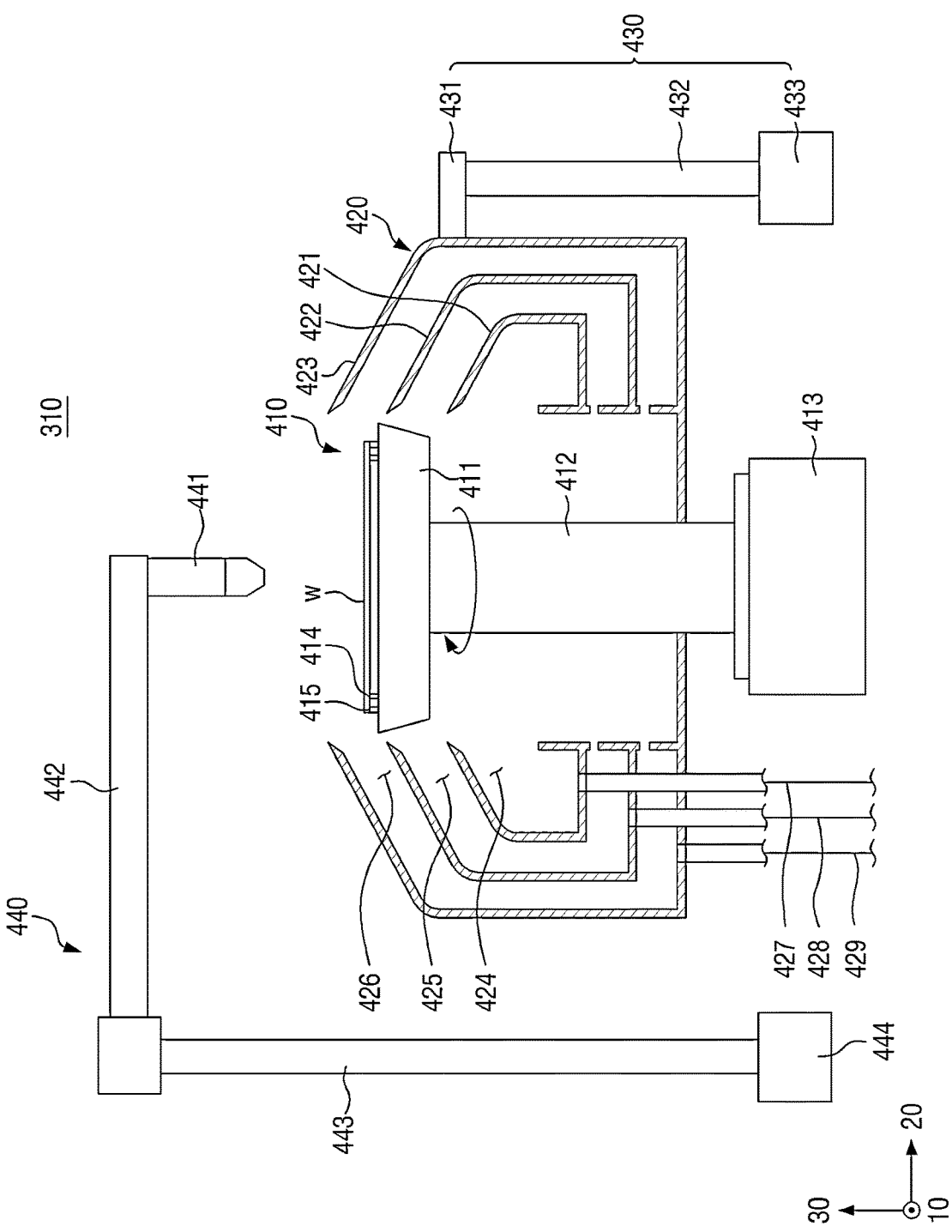
FIG. 6 is a schematic view illustrating the internal configuration of a substrate processing device for use in a cleaning process.

FIG. 6 is a schematic view illustrating the internal structure of the first substrate processing device 310.

Referring to FIG. 6, the substrate supporting unit 410 is a module supporting a substrate W. The substrate supporting unit 410 may rotate the substrate W in horizontal directions perpendicular to a third direction 30, i.e., in first and second directions 10 and 20, when processing the substrate W. The substrate supporting unit 410 may be disposed within the processing liquid recovery unit 420 to recover substrate processing liquids used to process the substrate W.

The substrate supporting unit 410 may be configured to include a spin head 411, a rotational shaft 412, a rotational driving module 413, support pins 414, and guide pins 415.

The spin head 411, which is also referred to as a spin chuck, rotates along the rotational direction of the rotational shaft 412 (or the horizontal directions). The spin head 411 may be provided with a shape identical to the shape of the substrate W, but the present disclosure is not limited thereto. The spin head 411 may also be provided with a different shape from the shape of the substrate W.

The rotational shaft 412 generates a rotational force using energy provided by the rotational driving module 413. The rotational shaft 412 may be coupled to both the rotational driving module 413 and the spin head 411 and may deliver the rotational force from the rotational driving module 413 to the spin head 411. The spin head 411 rotates along with the rotational shaft 412, in which case, the substrate W attached to the spin head 411 may also rotate with the spin head 411.

The support pins 414 and the guide pins 415 fix the substrate W on the spin head 411. The support pins 414 support the bottom surface of the substrate W on the spin head 411, while the guide pins 415 support the side surfaces of the substrate W. Multiple support pins 414 and multiple guide pins 415 may be installed on the spin head 411.

The support pins 414 may be arranged in a circular ring shape as a whole. As a result, the support pins 414 can support the bottom surface of the substrate W at a predetermined distance from the top of the spin head 411.

The guide pins 415, which are chucking pins, may support the substrate W in place and prevent the substrate W from being detached from its original position when the spin head 411 rotates.

The processing liquid recovery unit 420 recovers the processing liquid used to process the substrate W. The processing liquid recovery unit 420 may be installed around the substrate supporting unit 410, providing space for performing a processing operation on the substrate W.

After the substrate W is attached and fixed on the substrate supporting unit 410 and starts rotating under the control of the substrate supporting unit 410, the injection unit 440 may inject the substrate processing liquids onto the substrate W under the control of the control device 330. Then, due to the centrifugal force generated by the rotational force of the substrate supporting unit 410, the substrate processing liquids ejected onto the substrate W may be dispersed in the directions where the processing liquid recovery unit 420 is located. In this case, the processing liquid recovery unit 420 may recover the substrate processing liquids when the substrate processing liquids flow into its interior through inflow ports (i.e., a first outlet 424 of a first recovery tank 421, a second outlet 425 of a second recovery tank 422, and a third outlet 426 of a third recovery tank 423).

The processing liquid recovery unit 420 may be configured include multiple recovery tanks. For example, the processing liquid recovery unit 420 may include three recovery tanks. In this case, the substrate processing liquids used to process the substrate W may be separated and recovered, enabling the recycling of the substrate processing liquids.

The processing liquid recovery unit 420 may include three recovery tanks, i.e., the first, second, and third recovery tanks 421, 422, and 423. The first, second, and third recovery tanks 421, 422, and 423 may be implemented, for example, as bowls.

The first, second, and third recovery tanks 421, 422, and 423 may recover different substrate processing liquids. For example, the first recovery tank 421 may recover a rinse liquid (e.g., deionized (DI) water), the second recovery tank 422 may recover a first chemical solution, and the third recovery tank 423 may recover a second chemical solution.

The first, second, and third recovery tanks 421, 422, and 423 may be connected to recovery lines 427, 428, and 429 extending downward (or in the third direction 30) from the bottom surfaces of the first, second, and third recovery tanks 421, 422, and 423. First, second, and third processing liquids recovered through the first, second, and third recovery tanks 421, 422, and 423, respectively, may be processed and made reusable through a processing liquid regeneration system (not illustrated).

The first, second, and third recovery tanks 421, 422, and 423 may be provided in a circular ring shape surrounding the substrate supporting unit 410. The size of the first, second, and third recovery tanks 421, 422, and 423 may gradually increase from the first recovery tank 421 to the third recovery tank 423 (in the second direction 20). The distance between the first and second recovery tanks 421 and 422 may be defined as a first gap, and the distance between the second and third recovery tanks 422 and 423 may be defined as a second gap. The first gap may be the same as the second gap, but the present disclosure is not limited thereto. The first gap may differ from the second gap. In other words, the first gap may be larger or smaller than the second gap.

The elevating unit 430 is for rectilinearly moving the processing liquid recovery unit 420 in a vertical direction (or the third direction 30). The elevating unit 430 may adjust the relative height of the processing liquid recovery unit 420 with respect to the substrate supporting unit 410 (or the substrate W).

The elevating unit 430 may be configured to include a bracket 431, a first supporting shaft 432, and a first driving module 433.

The bracket 431 is fixed to the outer wall of the processing liquid recovery unit 420. The bracket 431 may be coupled with the first supporting axis 432, which moves in the vertical direction under the control of the first driving module 433.

When the substrate W is attached to the substrate supporting unit 410, the substrate supporting unit 410 may be positioned above the processing liquid recovery unit 420. Similarly, when the substrate W is detached from the substrate supporting unit 410, the substrate supporting unit 410 may also be positioned above the processing liquid recovery unit 420. In such cases, the elevating unit 430 may lower the processing liquid recovery unit 420.

When the substrate W is being processed, each substrate processing liquid ejected onto the substrate W may be recovered into one of the first, second, and third recovery tanks 421, 422, and 423, depending on the type of the corresponding substrate processing liquid. Even in this case, the elevating unit 430 may lift or lower the processing liquid recovery unit 420 to each desired position. For example, if the first processing liquid is used, the elevating unit 430 may lift the processing liquid recovery unit 420 to a height corresponding to a first outlet 424 of the first recovery tank 421.

Meanwhile, the elevating unit 430 may adjust the relative height of the processing liquid recovery unit 420 with respect to the substrate supporting unit 410 (or the substrate W) by rectilinearly moving the substrate supporting unit 410 in the vertical direction.

However, the present disclosure is not limited to this. Alternatively, the elevating unit 430 may adjust the relative height of the processing liquid recovery unit 420 with respect to the substrate supporting unit 410 (or the substrate W) by rectilinearly moving both the substrate supporting unit 410 and the processing liquid recovery unit 420 at the same time in the vertical direction.

The injection unit 440 is a module that supplies substrate processing liquids onto the substrate W during the processing of the substrate W. At least one injection unit 440 may be installed within the substrate processing unit 120. When multiple injection units 440 are installed within the substrate processing unit 120, the multiple injection units 440 may inject different substrate processing liquids onto the substrate W.

The injection unit 440 may include a nozzle 441, a nozzle support module 442, a second supporting shaft 443, and a second driving module 444.

The nozzle 441 is installed at one end of the nozzle support module 442. The nozzle 441 may be moved to a processing position or a standby position by the second driving module 444.

Here, the processing position refers to a region above the substrate W, while the standby position refers to regions other than the processing position. To eject a substrate processing liquid onto the substrate W, the nozzle 441 may be moved to the processing position. Then, after ejecting the substrate processing liquid onto the substrate W, the nozzle 441 may move away from the processing position to the standby position.

The nozzle support module 442 supports the nozzle 441. The nozzle support module 442 may extend in a direction corresponding to the length direction of the spin head 411. In other words, the length direction of the nozzle support module 442 may be provided along the second direction 20.

The nozzle support module 442 may be coupled to the second supporting shaft 443, which extends in a vertical direction with respect to its length direction. The second supporting shaft 443 may extend in a direction corresponding to the height direction of the spin head 411. In other words, the length direction of the second supporting shaft 443 can be provided along the third direction 30.

The second driving module 444 is a module that rotates and elevates the second supporting shaft 443 and the nozzle support module 442, which is linked with the second supporting shaft 443. As a result, the nozzle 441 may be moved to the processing position or the standby position.

Referring back to FIG. 5, the substrate processing liquid supply device 320 supplies substrate processing liquid to the first substrate processing device 310. To this end, the substrate processing liquid supply device 320 may be connected to the injection unit 440 of the first substrate processing device 310 and operate under the control of the control device 330.

The control device 330 controls the operation of the first substrate processing device 310. Specifically, the control device 330 may control the operation of the rotational driving module 413 of the substrate supporting unit 410, the first driving module 433 of the elevating unit 430, and the second driving module 444 of the injection unit 440.

The control device 330 may include a process controller, which consists of a microprocessor (or a computer) that executes control of the first substrate processing device 310 and the substrate processing liquid supply device 320, a user interface, which includes a keyboard for an operator to input commands and manage the first substrate processing device 310 and the substrate processing liquid supply device 320 and a display to visualize and display the operational status of the first substrate processing device 310 and the substrate processing liquid supply device 320, and a memory unit, which stores control programs for executing processes under the control of the process controller or programs (or processing recipes) for executing processes in the first substrate processing device 310 and the substrate processing liquid supply device 320 based on various data and processing conditions. The user interface and the memory unit may be connected to the process controller. The processing recipes may be stored on a storage medium within the memory unit, such as a hard disk, a compact disc read-only memory (CD-ROM), a digital versatile disc (DVD), or a flash memory.

Meanwhile, the control device 330 may also control the operation of the substrate processing liquid supply device 320 to supply substrate processing liquid to the first substrate processing device 310 when necessary.

As previously described, the air current measurement apparatus 100 may be applied to the substrate processing system 300, which performs a cleaning process on the substrate W, in order to measure the magnitude and movement direction of air currents on the surface of the substrate W. In this case, the air current measurement apparatus 100 may be installed on the spin head 411, which supports and rotates the substrate W during the processing of the substrate W.

The air current measurement apparatus 100 may be installed at the location where the substrate W is placed during the processing of the substrate W, and may perform the same functions described above. To this end, the air current measurement apparatus 100 may be formed to have the same shape as or a similar shape to a wafer.

Figure 7:
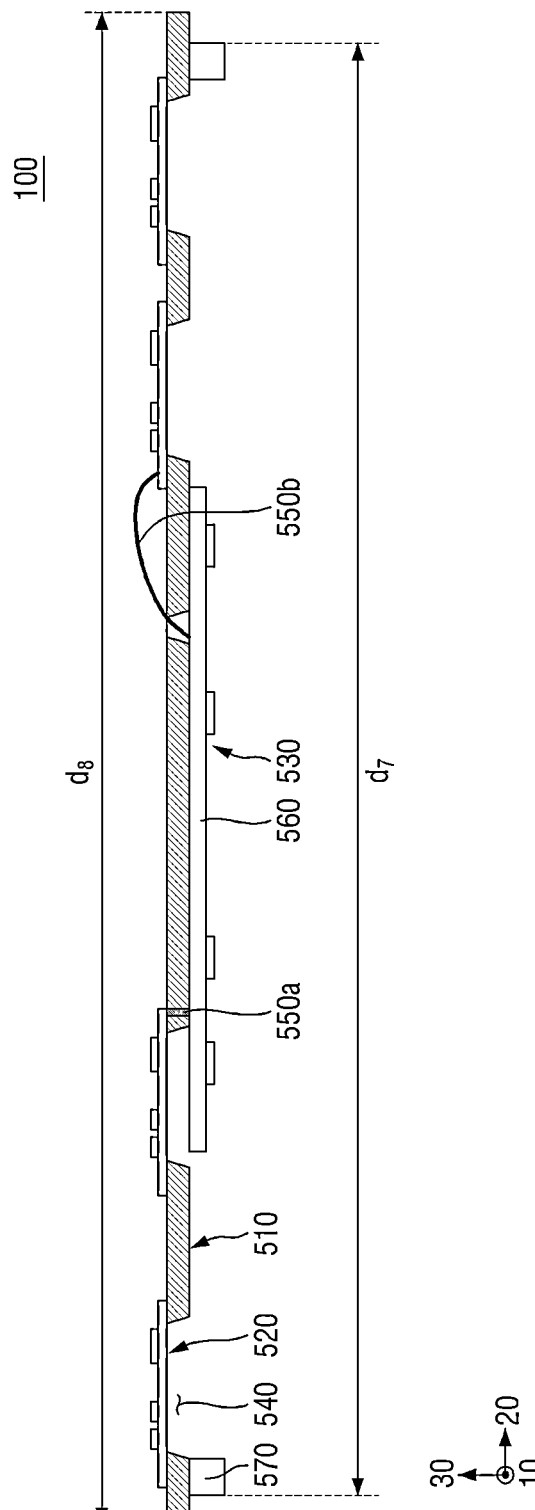
FIG. 7 is a side view illustrating the internal configuration of the apparatus for measuring air currents on the surface of a substrate.
Figure 8:
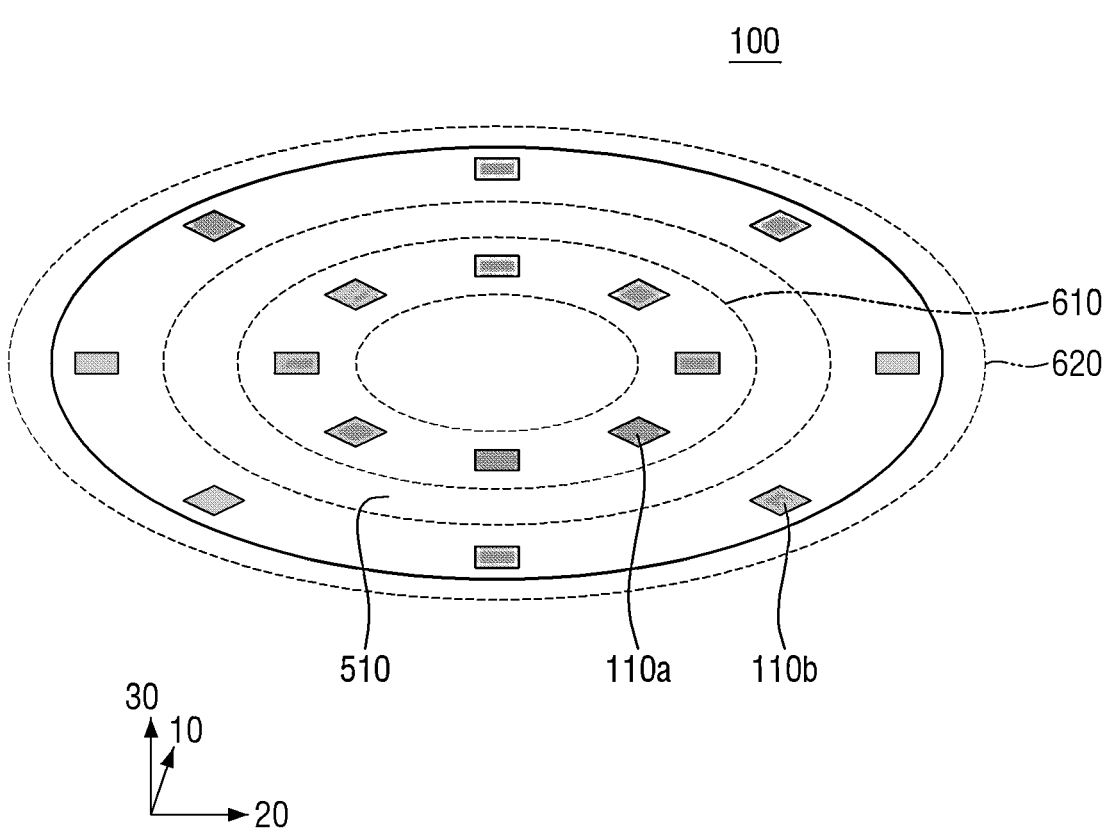
FIG. 8 is a schematic view illustrating the internal configuration of the apparatus for measuring air currents on the surface of a substrate.

FIG. 7 is a side view illustrating the internal configuration of the air current measurement apparatus 100. FIG. 8 is a schematic view illustrating the internal configuration of the air current measurement apparatus 100.

Anemometers may be classified into various types such as vane anemometer, ultrasonic anemometer, and hot-wire anemometer, depending on how they measure the magnitude of air currents. The vane anemometer measures the change in the rotation speed of its wings, similar to a windmill, according to the wind speed. However, the vane anemometer has significant measurement error depending on the angle, has a large volume, and is not suitable for measuring fine air current distribution on the surface of the substrate W.

In the case of the ultrasonic anemometer, two ultrasonic sensors face each other and measure the speed changes of ultrasound induced by the flow velocity using installation or reflection plates. The structure of the ultrasonic anemometer can be minimized by reducing the volume of the ultrasonic anemometer, but the ultrasonic anemometer faces difficulties in installing outside the outer diameter of the substrate W, making it challenging to measure air currents near the edges where significant air currents occur.

The hot-wire anemometer uses a wire with a micro diameter, making it structurally compact. The hot-wire anemometer can be optimized for measuring air currents around the substrate W, and offers good sensitivity to measure subtle changes in air currents. However, commercially available products in their typical forms have limitations in measuring fine air currents on the surface of the substrate W within the confined space of the spin head 411.

The air current measurement apparatus 100 forms a wind speed sensor pattern on the surface of the substrate W through a thin film or micro-electro mechanical system (MEMS) process based on the measurement principle of a hot-wire anemometer, and can measure air currents unaffected by the sensor structure. In other words, the air current measurement apparatus 100, unlike its conventional counterparts, can measure the magnitude and movement direction of air currents without affecting the direction or speed of the air currents. As a result, the air current measurement apparatus 100 can enhance the precision of measurements related to the magnitude and movement direction of air currents. Furthermore, since the measurement of the magnitude and movement direction of air currents is performed with the air current measurement apparatus 100 installed where the substrate W is located, the air current measurement apparatus 100 can also eliminate measurement errors caused by differences in the distance from the substrate W.

A hot-wire anemometer, which is a type of thermal transducer, is configured to measure temperature or speed by utilizing heat transfer between a fluid and a sensor. That is, the hot-wire anemometer operates on the principle that as heat is electrically applied to a wire positioned within the flow of the fluid, the rate of heat transfer varies with the flow velocity.

According to the present embodiment, a hot-wire anemometer may be configured as a thin-film pattern or a MEMS pattern on the surface of the substrate W and can maintain high accuracy even on the surface with low wind speed. As illustrated in FIG. 8, an array of such hot-wire anemometers may be configured to measure both the magnitude and movement direction of air currents.

Figure 9:
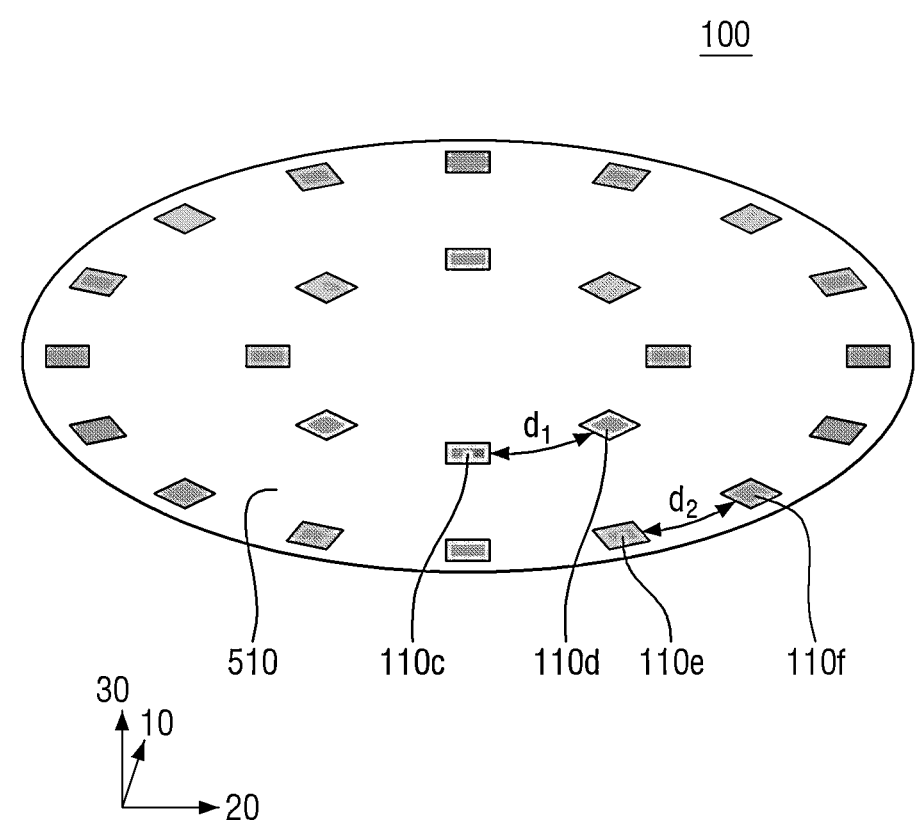
FIGS. 9 and 10 are first and second exemplary schematic views, respectively, illustrating different arrangements of a first air current measurement module in the apparatus for measuring air currents on the surface of a substrate.

The first air current measurement module 110 may be provided as a hot-wire anemometer. Referring to FIGS. 8 and 9, multiple first air current measurement modules 110 may be provided and arranged along the circumference of a wafer-shaped (or circular) substrate 510 in two rows, i.e., first and second rows 610 and 620, but the present embodiment is not limited thereto. Alternatively, the multiple first air current measurement modules 110 may be arranged along the circumference of the substrate 510 in three or more rows. Yet alternatively, the multiple first air current measurement modules 110 may be arranged along the circumference of the substrate 510 in a single row.

When the multiple first air current measurement modules 110 are arranged in two or more rows along the circumference of the substrate 510, the number of first air current measurement modules 110 arranged in one of the rows may be the same as or different from the number of first air current measurement modules 110 arranged in another one of the rows. Alternatively, some of the rows may have an equal number of first air current measurement modules 110, while other rows may have a different number of first air current measurement modules 110.

For example, as illustrated in FIGS. 8 and 9, when some of the multiple first air current measurement modules 110 are arranged in the first row 610 on the substrate 510 and the other first air current measurement modules 110 are arranged in the second row 620 on the substrate 510, the number of first air current measurement modules 110 arranged in the first row 610, i.e., the number of first air current measurement modules 110$a$, may be the same as the number of first air current measurement modules 110 arranged in the second row 620, i.e., the number of first air current measurement modules 110$b$.

Referring to FIG. 9, among the first air current measurement modules 110$a$ in the first row 610, two different first air current measurement modules, i.e., first air current measurement modules 110$c$ and 110$d$, may be spaced apart from each other by a distance $d_1$. Similarly, among the first air current measurement modules 110$b$ in the second row 620, two different first air current measurement modules, i.e., first air current measurement modules 110$e$ and 110$f$, may be spaced apart from each other by a distance $d_2$. Here, the distance $d_1$ between the first air current measurement modules 110$c$ and 110$d$ in the first row 610 may be the same as the distance $d_2$ between the first air current measurement modules 110$e$ and 110$f$ in the second row 620 (i.e., $d_1 = d_2$). In this case, the number of first air current measurement modules 110$a$ arranged in the first row 610 may be different from the number of first air current measurement modules 110$b$ arranged in the second row 620. FIG. 9 is a first exemplary schematic view illustrating the arrangement of the multiple first air current measurement modules 110 within the air current measurement apparatus 100.

Figure 10:
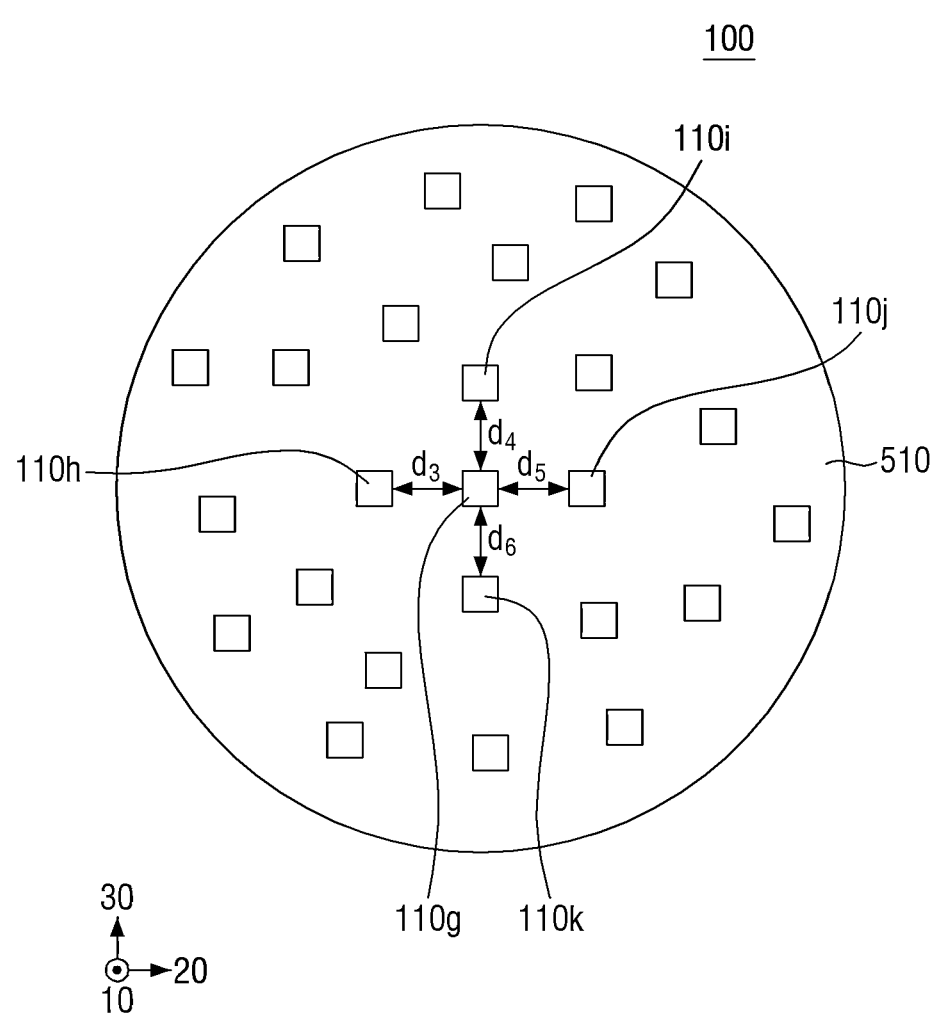

The multiple first air current measurement modules 110 may not necessarily be arranged on the substrate 510 according to predetermined criteria, as illustrated in FIGS. 8 and 9, but may also be randomly arranged. For example, referring to FIG. 10, the multiple first air current measurement modules 110 may be randomly arranged. Even in this example, to minimize the waste of the first air current measurement modules 110, a particular first air current measurement module 110$g$ may preferably maintain a uniform distance from other neighboring first air current measurement modules 110$h$, 110$i$, 110$j$, and 110$k$ (i.e., $d_3 = d_4 = d_5 = d_6$). FIG. 10 is a second exemplary schematic view illustrating the arrangement of the multiple first air current measurement modules 110 within the air current measurement apparatus 100.

Various arrangements of the multiple first air current measurement modules 110 have been described so far with reference to FIGS. 8 through 10. However, it should be noted that various modifications can be made to the array of the first air current measurement modules 110 in terms of quantity and location to precisely control the accuracy of air current magnitude and direction measurement.

As described earlier with reference to FIG. 1, the air current measurement apparatus 100 may be configured to include the first air current measurement module 110, the second air current measurement module 120, the power module 130, and the main control module 140. The air current measurement apparatus 100 may be structured as illustrated in FIG. 7 to be installed on the spin head 411 within the first substrate processing device 310, and this will hereinafter be described.

Referring to FIG. 7, the first air current measurement module 110 may be positioned on top of the substrate 510, while the second air current measurement module 120, the power module 130, and the main control module 140 may be positioned at the bottom of the substrate 510. The air current measurement apparatus 100 may be structured in this configuration in a case where the second air current measurement module 120 calculates the movement direction of air currents based on air current measurements from multiple first air current measurement modules 110.

However, the present embodiment is not limited to this. The first and second air current measurement modules 110 and 120 may both be positioned on top of the substrate 510, while the power module 130 and the main control module 140 may be positioned at the bottom of the substrate 510. The air current measurement apparatus 100 may be structured in this configuration in a case where the second air current measurement module 120 measures the movement direction of air currents independently from the first air current measurement module 110.

In a case where the first air current measurement module 110 is positioned on top of the substrate 510 and the second air current measurement module 120, the power module 130, and the main control module 140 are positioned at the bottom of the substrate 510, the first air current measurement module 110 may be provided in the form of air current sensors 520 and arranged on top of the substrate 510. In this case, the areas of the substrate 510 below the air current sensors 520 may be left empty. Specifically, holes 540 may be formed in the substrate 510, and the air current sensors 520 can be placed on top of the holes 540. The size of the air current sensors 520 may be relatively larger than the size of the holes 540.

The configuration where portions of the substrate 510 below the air current sensors 520 are removed by forming the holes 540 in the substrate 510 and the air current sensors 520 are placed on the holes 540 can provide favorable effects in terms of preventing heat diffusion. With this configuration, the air current measurement apparatus 100 can enhance the accuracy of measurements.

The second air current measurement module 120, the power module 130, and the main control module 140 may be coupled to the bottom of the substrate 510 in the form of a power/signal processing device 530. The power/signal processing device 530 may be electrically connected to the air current sensors 520 using a connector 550a to supply power to the air current sensors 520. Alternatively, the power/signal processing device 530 may be electrically connected to the air current sensors 520 using wiring 550b.

To avoid affecting air currents on the surface of the substrate 510, the power/signal processing device 530 may be installed very thinly (e.g., as thin as about 1 mm) below the substrate 510. The power/signal processing device 530 may be embedded on the bottom surface of the substrate 510 by performing etching on the bottom of the substrate 510. Alternatively, the power/signal processing device 530 may be mounted on a separate substrate 560 (hereinafter, "substrate b" to be distinguished from the substrate 510) and then coupled to the substrate 510 (hereinafter, "substrate a" to be distinguished from substrate b), where the air current sensors 520 are installed.

The power/signal processing device 530 may be powered by a thin-film battery or may be supplied with power through micro-wires. Measurement data from the air current sensors 520 may be stored in the power/signal processing device 530 and may be wirelessly transmitted in real-time to each destination through a separate communication module (not illustrated).

To install the air current measurement apparatus 100 on the spin head 411, multiple edge rings 570 may be installed in the bottom edge area of the substrate 510. The air current measurement apparatus 100 may be fastened to the spin head 411 using the edge rings 570. The edge rings 570 may be formed of a material such as silicon or alumina.

Figure 11:
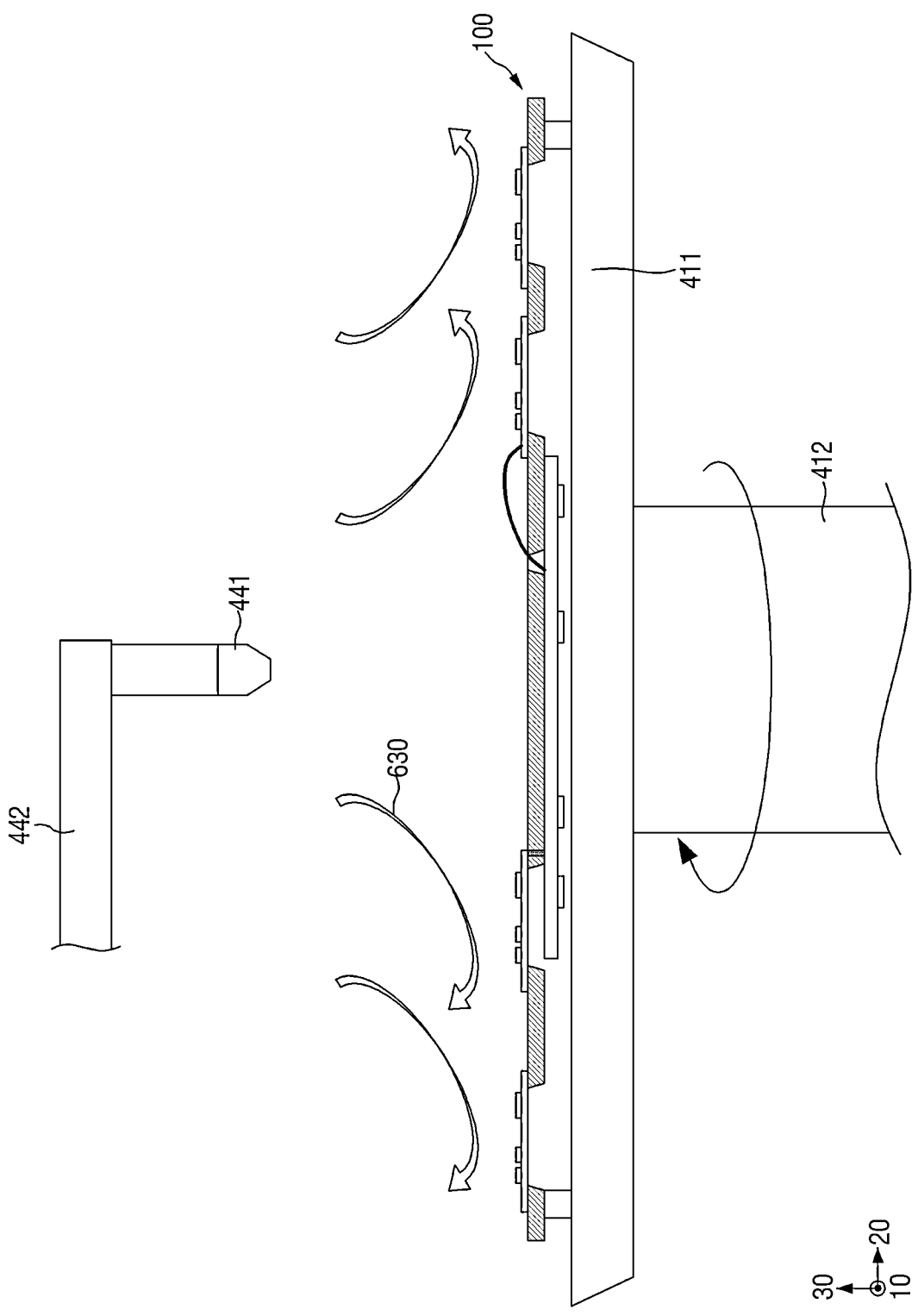
FIG. 11 is an exemplary schematic view illustrating the shape of installation of the apparatus for measuring air currents on the surface of a substrate within a first substrate processing device.

Referring to FIG. 11, the edge rings 570 may be arranged along the bottom circumference of the substrate 510, and a height $h_1$ of the edge rings 570 may be greater than a height $h_2$ of the power/signal processing device 530 (i.e., $h_1 > h_2$) to prevent contact with the spin head 411. Alternatively, if the power/signal processing device 530 is embedded in the bottom of the substrate 510, the edge rings 570 may have the same height as the power/signal processing device 530 (i.e., $h_1 = h_2$).

The edge rings 570 may be configured to be smaller in diameter than a typical wafer to allow the air current measurement apparatus 100 to be fastened to the spin head 411. That is, a distance $d_7$ between two different edge rings 570 may be smaller than a size $d_8$ of the substrate 510 (i.e., $d_7 < d_8$). Alternatively, the distance $d_7$ between two different edge rings 570 may be the same as the size $d_8$ of the substrate 510 ($d_7 = d_8$).

In a case where the first and second air current measurement modules 110 and the 120 are positioned on the substrate 510 and the power module 130 and the main control module 140 are positioned below the substrate 510, the first and second air current measurement modules 110 and 120 may both be integrated into the air current sensors 520 and placed on the top of the substrate 510. Other features of the air current measurement apparatus 100 are as described above with reference to FIGS. 7 and 11, and thus, detailed descriptions thereof will be omitted.

The air current measurement apparatus 100, described with reference to FIGS. 7 and 11, can measure the magnitude and movement direction of air currents 630 on the surface of the substrate 510 within the first substrate processing device 310 during an upper fan filter unit (FFU)/spin operation. Accordingly, the air current measurement apparatus 100 can accurately measure whether and in what magnitude the air currents 630 flow uniformly on the surface of the substrate 510. FIG. 11 is an exemplary schematic view illustrating the shape of installation of the air current measurement apparatus 100 within the first substrate processing device 310.

When installed within semiconductor manufacturing equipment, the air current measurement apparatus 100 may be applied to a substrate processing system performing a cleaning process, as explained earlier, as well as to a substrate processing system performing a heat treatment process.

A case where the air current measurement apparatus 100 is applied to a substrate processing system performing a heat treatment process will hereinafter be described.

As will be described later with reference to FIGS. 12 and 13, the substrate processing system performing a heat treatment process may include a second substrate processing device 700 and a control module. The control module may control the second substrate processing device 700 and may be provided in the form of the control device 330 of FIG. 5. The control module differs from the control device 330 of FIG. 5 in that it controls the second substrate processing device 700, while the control device 330 controls the first substrate processing device 310 and the substrate processing liquid supply device 320. The control module will hereinafter be described.

Figure 12:
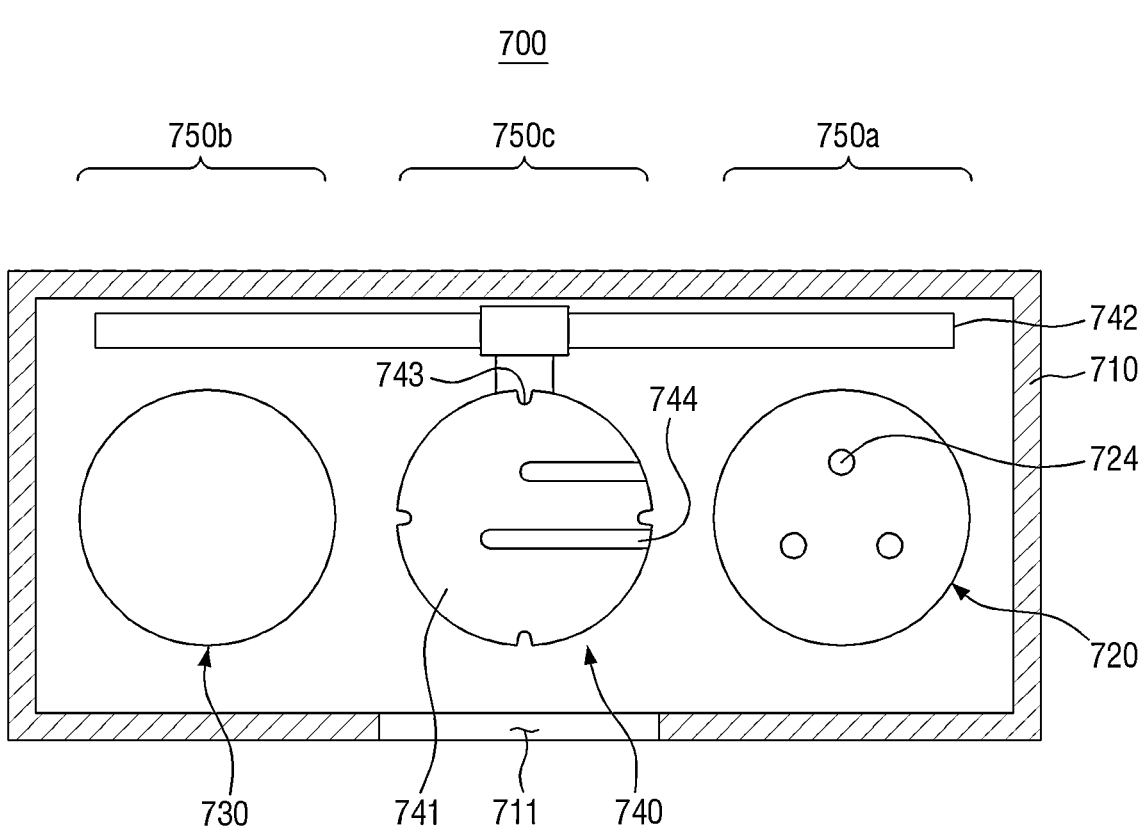
FIGS. 12 and 13 are a plan view and a cross-sectional view, respectively, illustrating the internal configuration of a substrate processing device for use in a heat treatment process.
Figure 12:
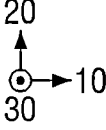
Figure 13:
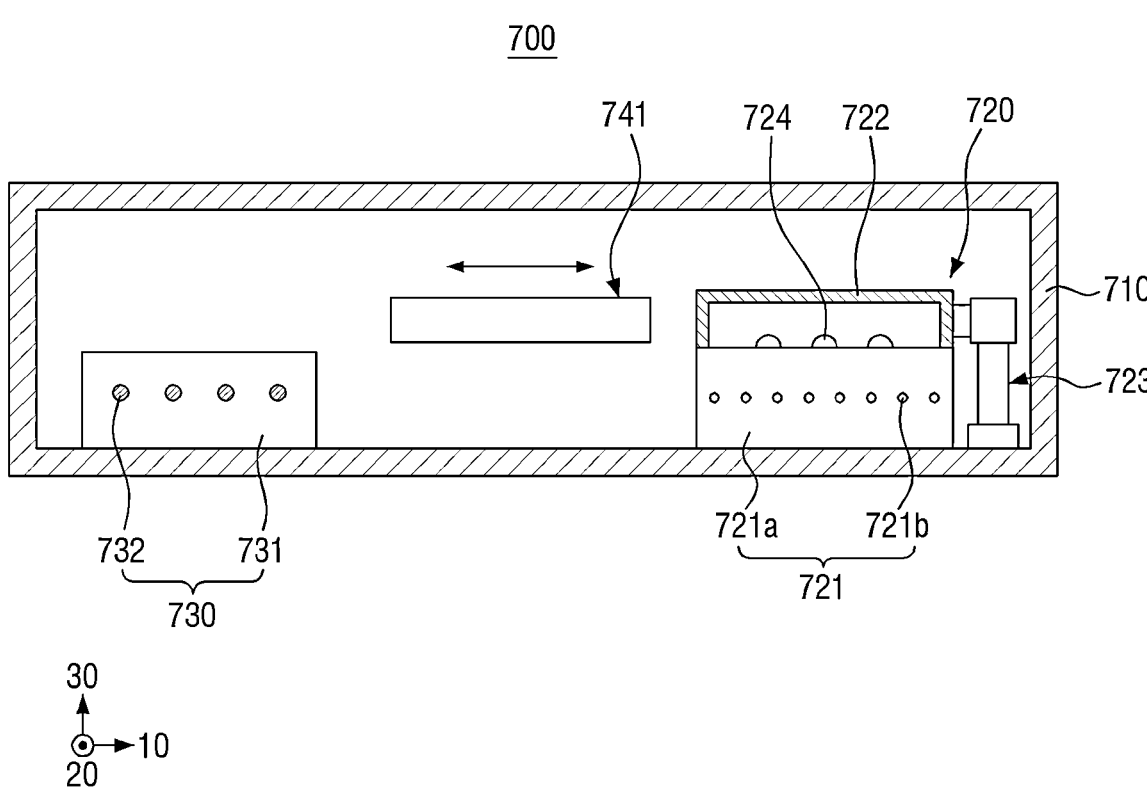

FIGS. 12 and 13 are a plan view and a cross-sectional view, respectively, illustrating the internal configuration of a substrate processing device for use in a heat treatment process.

Referring to FIGS. 12 and 13, the second substrate processing device 700 may include a housing 710, a heating unit 720, a cooling unit 730, and a transport unit 740.

The second substrate processing device 700 is a device for heating and cooling a substrate (e.g., a wafer). When performing a photolithography process on a substrate, the second substrate processing device 700 may heat and cool the substrate. For example, the second substrate processing device 700 may be provided as a bake chamber for performing a bake process.

The photolithography process may include processes such as photoresist coating, exposure, development, and baking processes. In this case, the second substrate processing device 700 may heat and/or cool the substrate before or after the photoresist coating process. Alternatively, the second substrate processing device 700 may heat and/or cool the substrate before or after the exposure process. Yet alternatively, the second substrate processing device 700 may heat and/or cool the substrate before or after the development process.

The housing 710 provides a space for processing the substrate. The housing 710 may be installed to include the heating unit 720, the cooling unit 730, and the transport unit 740 therein to enable the heating and cooling of the substrate.

The side walls of the housing 710 may have an entrance port 711 for the substrate to enter or exit the housing 710. At least one entrance port 711 may be provided in the housing 710. The entrance port 711 may be open at all times. Alternatively, although not illustrated in FIG. 12, the entrance port 711 may be opened or closed with a door.

The interior space of the housing 710 may be divided into a heating region 750a, a cooling region 750b, and a buffer region 750c. The heating region 750a refers to the region where the heating unit 720 is positioned, while the cooling region 750b refers to the region where the cooling unit 730 is positioned. The width of the heating region 750a may be the same as or greater than the width of the heating unit 720. Similarly, the width of the cooling region 750b may be the same as or wider than the width of the cooling unit 730.

The buffer region 750c refers to the region where a transport plate 741 of the transport unit 740 is placed. The buffer region 750c may be provided between the heating region 750a and the cooling region 750b. As the buffer region 750c is provided, the heating unit 720 and the cooling unit 730 can be sufficiently separated, preventing thermal interference between the heating unit 720 and the cooling unit 730. The width of the buffer region 750c may be the same as or greater than the width of the transport plate 741, like the case with the heating region 750a and the cooling region 750b.

In a case where the heating unit 720, the cooling unit 730, and the transport unit 740 are disposed in the heating region 750a, the cooling region 750b, and the buffer region 750c, respectively, within the housing 710, the cooling unit 730, the transport unit 740, and the heating unit 720 may be sequentially arranged along the first direction 10, but the present embodiment is not limited thereto. Alternatively, the heating unit 720, the transport unit 740, and the cooling unit 730 may be sequentially arranged along the first direction 10.

The heating unit 720 is for heating the substrate. When heating the substrate, the heating unit 720 may supply gas onto the substrate. For example, the heating unit 720 may provide a hexamethyldisilane gas, which enhances the adhesion rate of photoresist on the substrate.

The heating unit 720 may include a heating plate 721, a cover 722, and a driver 723 to heat the substrate.

The heating plate 721, which is also referred to as a hot plate, is for applying heat to the substrate. To this end, the heating plate 721 may include a main body 721a and heaters 721b.

The main body 721a supports the substrate during heating. The main body 721a may be formed with the same diameter as or a larger diameter than the substrate.

The main body 721a may be formed of a metal with excellent heat resistance. Alternatively, the main body 721a may be formed of a metal with excellent fire resistance. The main body 721 may be formed of, for example, ceramics, such as aluminum oxide ($Al_2O_3$) or aluminum nitride (AlN).

Although not explicitly illustrated in FIGS. 12 and 13, the main body 721a may include a plurality of vacuum holes, which are formed to penetrate through the main body 721a in the vertical direction (or the third direction 30). The vacuum holes may fix the substrate when applying heat to the substrate by forming vacuum pressure.

Meanwhile, although not explicitly illustrated in FIGS. 12 and 13, the main body 721a may be divided into an upper plate and a lower plate. The substrate may be placed on the upper plate, and the heaters 721b may be installed within the lower plate.

The heaters 721b are for applying heat to the substrate on the upper plate of the main body 721a. Multiple heaters 721b may be installed within the main body 721a. The heaters 721b may be provided as heat-generating resistance elements (e.g., heating wires) with electric current applied thereto, but the present embodiment is not limited thereto. Other forms than heat-generating resistance elements are also acceptable as long as they can effectively heat the substrate on the upper plate of the main body 721a.

The cover 722 is formed to cover the upper portion of the heating plate 721 when the heating plate 721 heats the substrate. The cover 722 may be moved in the vertical direction (or the third direction 30) under the control of the driver 723 to open or close the upper portion of the heating plate 721.

The driver 723 is for moving the cover 722 in the vertical direction (or the third direction 30). When the substrate is placed on the heating plate 721 for heat treatment, the driver 723 may move the cover 722 in a downward direction of the housing 710 to fully cover the upper portion of the heating plate 721. Additionally, when heat treatment for the substrate is complete and the transport unit 740 moves the substrate to the cooling unit 730, the driver 723 may move the cover 722 in an upward direction of the housing 710 to expose the upper portion of the heating plate 721.

The cooling unit 730 is for cooling the substrate heated by the heating unit 720. The cooling unit 730 may include a cooling plate 731 and cooling elements 732.

When high-temperature heat is applied to the substrate through the heating unit 720, warpage of the substrate may occur. The cooling unit 730 may restore the substrate to its original state by cooling the substrate heated by the heating unit 720 to an appropriate temperature.

The cooling elements 732 are formed within the cooling plate 731 and may be provided in the form of channels through which cooling fluid can flow.

The transport unit 740 is for moving the substrate to the heating unit 720 or the cooling unit 730. The transport unit 740 may have a handle with a transport plate 741 attached to one end and may move the transport plate 741 along a guide rail 742 towards the heating unit 720 or the cooling unit 730.

The transport plate 741 may be disk-shaped and may be formed to have a matching diameter for the substrate. The transport plate 741 may include multiple notches 743, which are formed along the edge of the transport plate 741, and multiple guide grooves 744, which are on the top surface of the transport plate 741 and have a slit shape.

The guide grooves 744 may be formed to extend from the end of the transport plate 741 in a radial direction towards the center of the transport plate 741. In this case, the guide grooves 744 may be formed to be spaced apart in the same direction (e.g., the first direction 10). The guide grooves 744 may prevent interference between the transport plate 741 and lift pins 724 when transferring the substrate between the transport plate 741 and the heating unit 720.

The heating of the substrate is conducted when the substrate is placed directly on the heating plate 721, while the cooling of the substrate is conducted when the substrate is in contact with the cooling plate 731 on the transport plate 741. To ensure efficient heat transfer between the cooling plate 731 and the substrate, the transport plate 741 may be formed of a material (e.g., a metal) with excellent heat transfer efficiency.

Meanwhile, although not explicitly illustrated in FIGS. 12 and 13, the transport unit 740 may receive the substrate through the entrance port 711 of the housing 710 from an external substrate transfer robot.

The lift pins 724 have a free-fall structure and are for lifting the substrate from the heating plate 721. When the substrate is subjected to a bake process, the lift pins 724 receive the substrate from the transport unit 740 and lower the substrate onto the heating plate 721. When the bake process is completed, the lift pins 724 rise from the heating plate 721 to transfer the substrate to the transport unit 740. To this end, the lift pins 724 may be formed to penetrate through the heating plate 721 in the vertical direction (or the third direction 30).

The lift pins 724, like the main body 721a, may be formed of a material with excellent heat resistance or a material with excellent fire resistance. In this case, the lift pins 724 may be formed of the same metal as the main body 721a. Alternatively, the lift pins 724 and the main body 721a may be formed of different metals.

The lift pins 724 may be operated using, for example, a linear motor (LM) guide system and controlled by multiple cylinders connected to the LM guide system. The LM guide system has the advantage of being able to withstand high temperatures and vibrations.

Meanwhile, to stably support the substrate when lifting the substrate off of the heating plate 721, multiple lift pins 724 may be installed. For example, as illustrated in FIGS. 12 and 13, three lift pins 724 may be installed.

As mentioned earlier, the air current measurement apparatus 100 may be applied to the second substrate processing device 700, which performs a heat treatment process on the substrate to measure the intensity and movement direction of air currents on the surface of the substrate. In this case, the air current measurement apparatus 100 may be installed on the heating plate 721, which supports and heats the substrate during the processing of the substrate. Alternatively, the air current measurement apparatus 100 may be installed on the cooling plate 731, which supports and cools the substrate during the processing of the substrate.

The air current measurement apparatus 100 may be fastened to the heating plate 721 or the cooling plate 731 using multiple edge rings 570. When installed on the heating plate 721 or the cooling plate 731, the air current measurement apparatus 100 can accurately measure whether and in what magnitude air currents formed by an upper intake device or a side door of a bake unit in the second substrate processing device 700 flow uniformly on the surface of the substrate.

However, the present embodiment is not limited to this. If the air current measurement apparatus 100 can maintain a flat state without tilting when placed on the heating plate 721 or the cooling plate 731, the air current measurement apparatus 100 may be formed without the edge rings 570 by embedding the power/signal processing device 530 in the bottom of the substrate 510.

Figure 14:
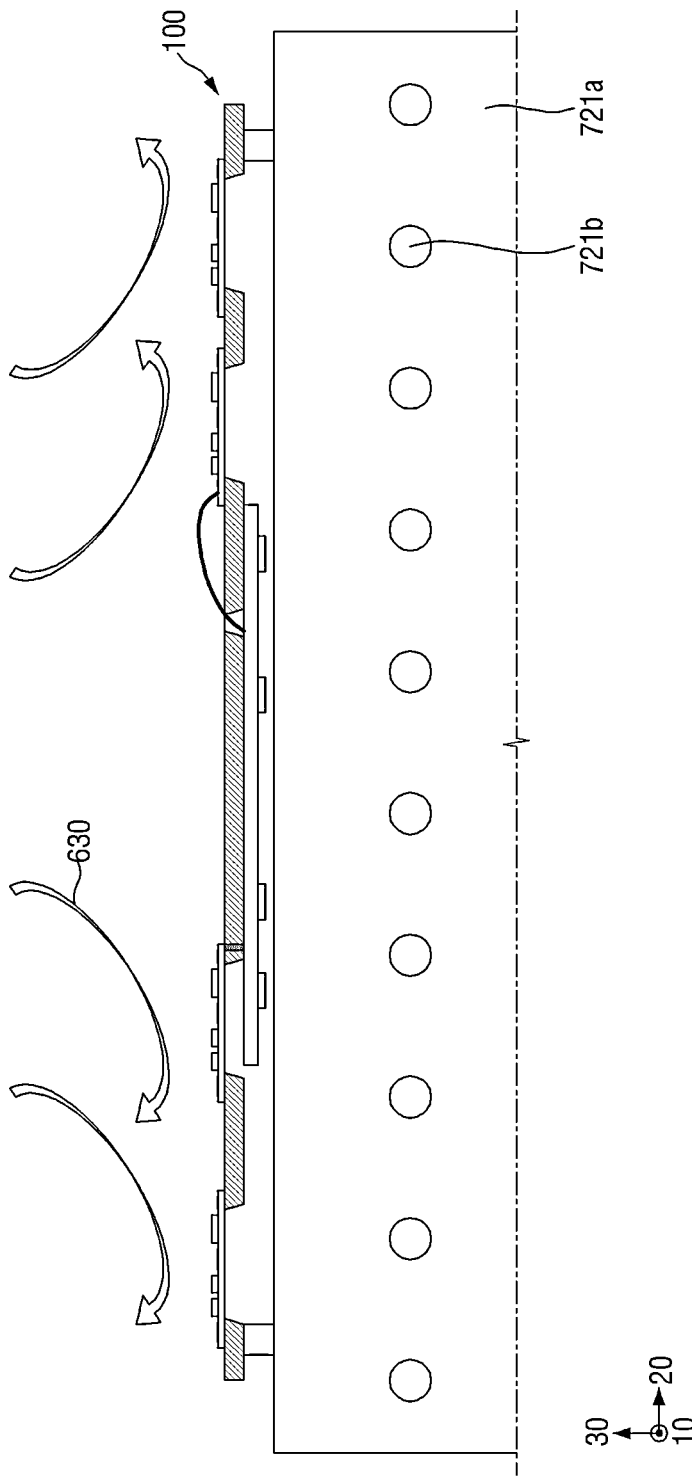
FIG. 14 is an exemplary schematic view illustrating the shape of installation of the apparatus for measuring air currents on the surface of a substrate within a second substrate processing device.

The structure of the air current measurement apparatus 100 has been described earlier with reference to FIGS. 7 through 10, and thus, a detailed description thereof will be omitted. FIG. 14 is an exemplary schematic view illustrating the shape of installation of the air current measurement apparatus 100 within the second substrate processing device 700.

The cases where the air current measurement apparatus 100 is applied to a substrate processing system performing a wet cleaning process and to a substrate processing system performing a heat treatment process have been described with reference to FIGS. 5 through 14. The exemplary operation of the air current measurement apparatus 100, described above with reference to FIG. 3, may be applicable in the case where the air current measurement apparatus 100 is applied to a substrate processing system performing a heat treatment process. On the contrary, the exemplary operation of the air current measurement apparatus 100, described above with reference to FIG. 4, may be applicable in the case where the air current measurement apparatus 100 is applied to a substrate processing system performing a wet cleaning process.

An air current measurement method of the air current measurement apparatus 100 will hereinafter be described. Specifically, an air current measurement method for a substrate processing system performing a wet cleaning processes will be described first, and an air current measurement method for a substrate processing system performing a heat treatment processes will then be described.

Figure 15:
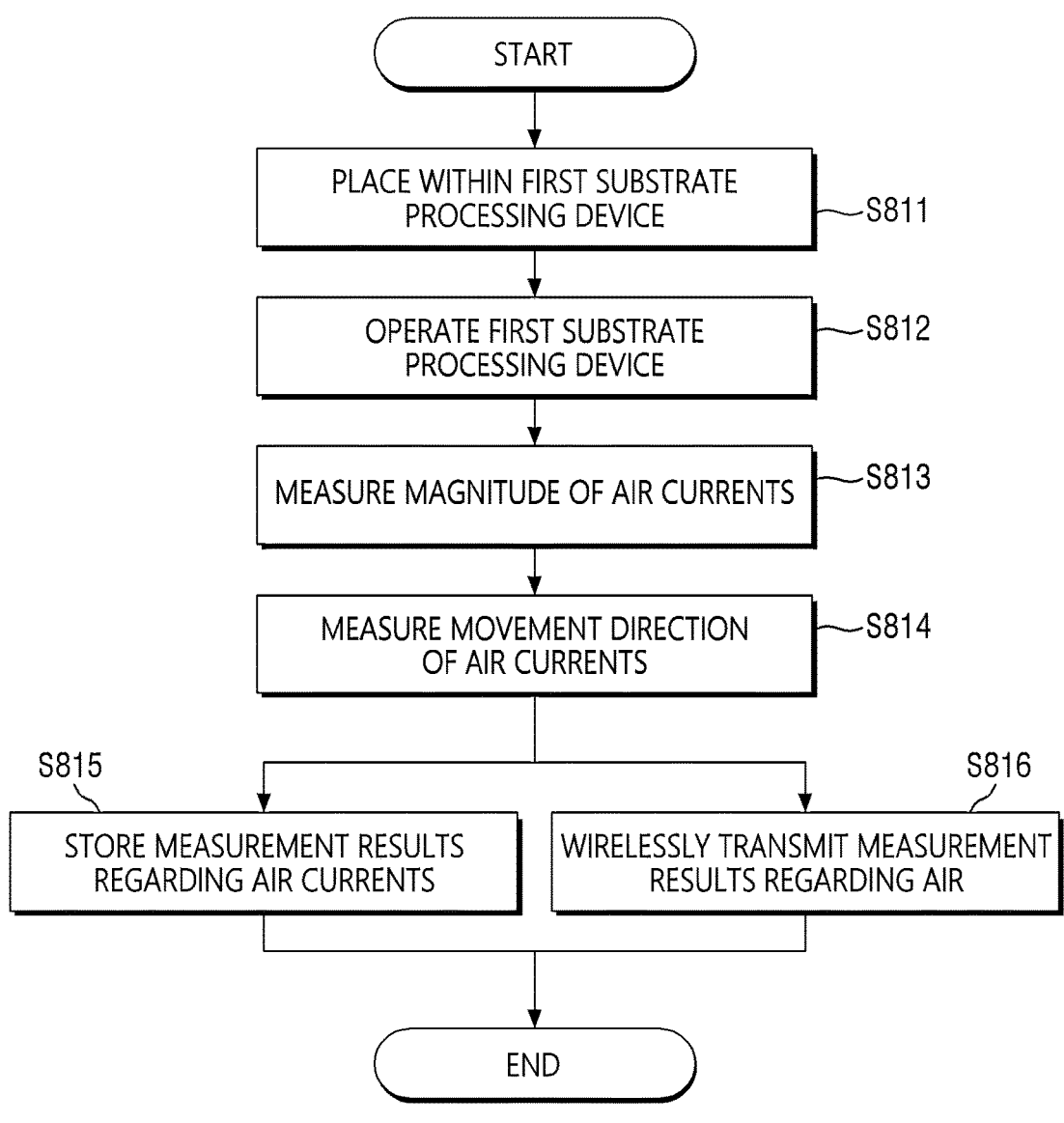
FIG. 15 is a flowchart illustrating an air current measurement method of the apparatus for measuring air currents on the surface of a substrate according to a first embodiment.

FIG. 15 is a flowchart illustrating an air current measurement method of the air current measurement apparatus 100 according to a first embodiment. The air current measurement method of FIG. 15 is for accurately measuring air currents on the surface of a substrate within a spin chuck.

Referring to FIG. 15, the air current measurement apparatus 100 is placed on the spin head 411 within the first substrate processing device 310 using a substrate transport robot (S811).

Thereafter, the first substrate processing device 310 is operated, creating the same environment as when processing a substrate within the first substrate processing device 310 (S812). That is, an upper FFU/spin operation may be performed within the first substrate processing device 310.

Thereafter, the magnitude of air currents on the surface of the substrate is measured using the first air current measurement module 110 (S813). Additionally, the movement direction of the air currents on the surface of the substrate is measured using the second air current measurement module 120 (S814). S813 and S814 may be performed simultaneously, but it's also acceptable to perform either one of S813 and S814 first.

Thereafter, the main control module 140 stores the results of the measurement of the magnitude and movement direction of the air currents in a memory module (not illustrated) (S815). Alternatively, the main control module 140 transmits the measurement results to a designated terminal using a communication module (not illustrated) (S816). Alternatively, S816 may be performed after S815. The memory module and the communication module may be integrated into the power/signal processing device 530 of FIG. 7.

Figure 16:
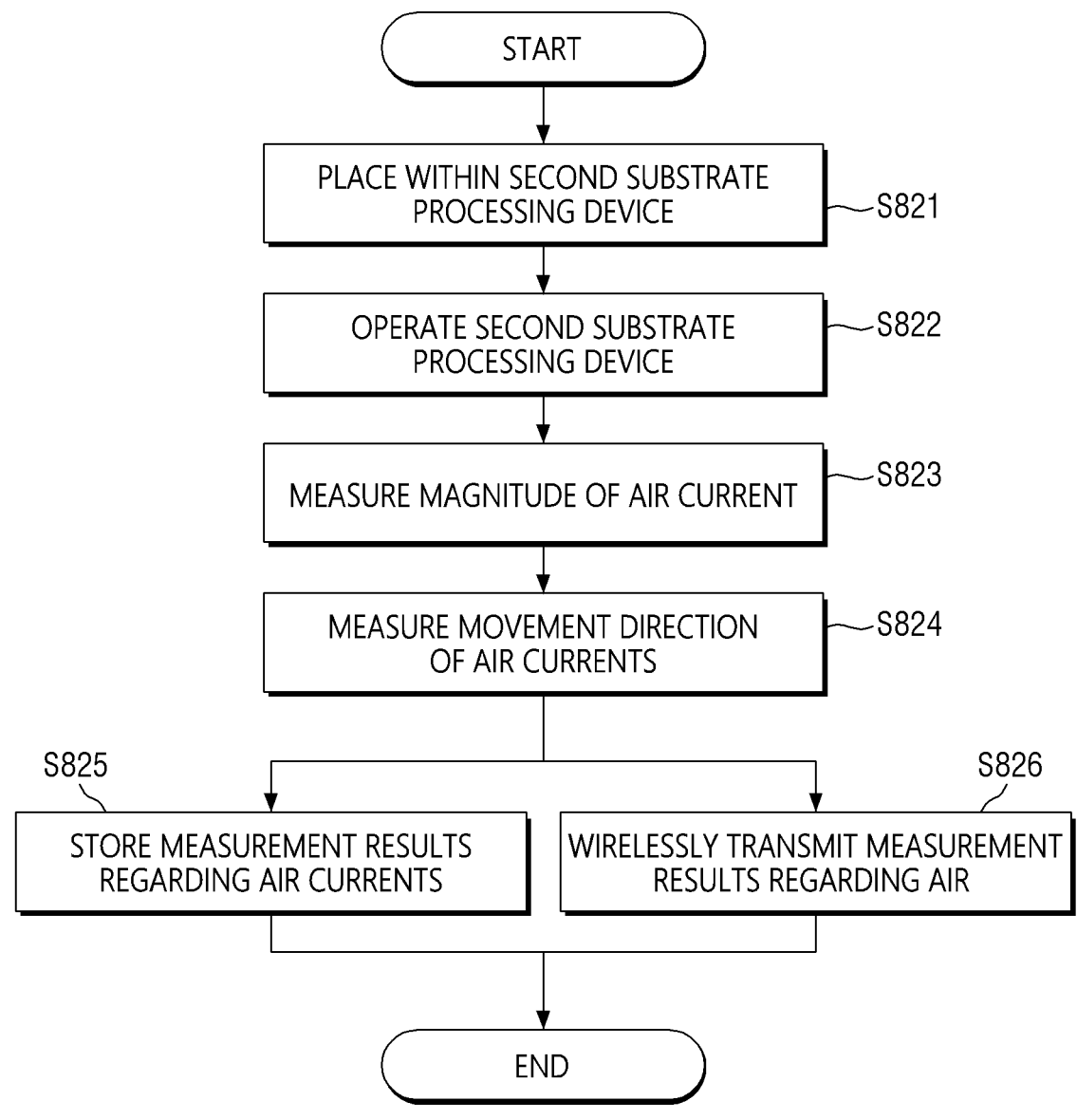
FIG. 16 is a flowchart illustrating an air current measurement method of the apparatus for measuring air currents on the surface of a substrate according to a second embodiment.

FIG. 16 is a flowchart illustrating an air current measurement method of the air current measurement apparatus 100 according to a second embodiment. The air current measurement method of FIG. 16 is for accurately measuring air currents on the surface of a substrate within a bake unit.

Referring to FIG. 16, the air current measurement apparatus 100 is placed on the heating plate 721 (or the cooling plate 731) within the second substrate processing device 700 using a substrate transport robot (S821).

Thereafter, the second substrate processing device 700 is activated, creating the same environment as when processing a substrate within the second substrate processing device 700 (S822). In other words, within the second substrate processing device 700, air currents can be generated by the upper intake device or the side door.

Thereafter, the magnitude of air currents on the surface of the substrate is measured using the first air current measurement module 110 (S823). Furthermore, the movement direction of the air currents on the surface of the substrate is measured using the second air current measurement module 120 (S824). S823 and S824 may be performed simultaneously, but it's also acceptable to perform either one of S823 and S824 first.

Thereafter, the main control module 140 stores the results of the measurement of the magnitude and movement direction of the air currents in the memory module (S825). Alternatively, the main control module 140 transmits the measurement results to a designated terminal using the communication module (S826). Alternatively, S826 may be performed after S825.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. An apparatus for measuring air currents on a surface of a substrate, comprising:
   a first air current measurement module measuring a magnitude of air currents on a surface of a first substrate, which is processed in accordance with a semiconductor manufacturing process;
   a second air current measurement module measuring a movement direction of the air currents; and
   a power module supplying power to the first and second air current measurement modules,
   wherein
   the apparatus further comprises at least one of a memory module, which stores measurement results regarding the air currents, and a communication module, which transmits the measurement results regarding the air currents to outside, and
   the first air current measurement module, the second air current measurement module, the power module, the memory module, and the communication module are mounted on a second substrate, which has the same shape as the first substrate.

2. The apparatus of claim 1, wherein the second air current measurement module calculates the movement direction of the air currents using multiple first air current measurement modules.

3. The apparatus of claim 1, wherein the apparatus is installed within a first substrate processing device performing a cleaning process on the first substrate or within a second substrate processing device performing a heat treatment process on the first substrate.

4. The apparatus of claim 3, wherein when installed within the first substrate processing device, the apparatus is fastened on a spin chuck, which rotates the first substrate.

5. The apparatus of claim 3, wherein when installed within the first substrate processing device, the apparatus is fastened on a plate of a unit that heat-treats the first substrate.

6. The apparatus of claim 3, wherein the apparatus is fastened within the first or second substrate processing device using multiple edge rings, which are installed at a bottom of the second substrate.

7. The apparatus of claim 6, wherein a distance between edge rings at both ends of the second substrate is smaller than a diameter of the second substrate.

8. The apparatus of claim 1, wherein the first air current measurement module is a thermal transducer.

9. The apparatus of claim 1, wherein the first air current measurement module is formed on a surface of the second substrate as a thin film pattern or as a micro-electro mechanical system (MEMS) pattern.

10. The apparatus of claim 1, wherein the multiple first air current measurement modules are arranged in multiple rows along a circumference of the surface of the second substrate or are arranged at intervals of a predetermined distance.

11. The apparatus of claim 1, wherein
   the first air current measurement module is disposed at a top of the second substrate, and
   the second air current measurement module, the power module, the memory module, and the communication module are disposed at a bottom of the second substrate.

12. The apparatus of claim 11, wherein the first air current measurement module is disposed in a hole formed in the second substrate.

13. The apparatus of claim 11, wherein the second air current measurement module, the power module, the memory module, and the communication module are electrically connected to the first air current measurement module using a connector or a wire.

14. The apparatus of claim 11, wherein the second air current measurement module, the power module, the memory module, and the communication module are embedded at the bottom of the second substrate or are installed on a third substrate, which is coupled to the bottom of the second substrate.

15. The apparatus of claim 1, wherein the power module supplies power to the first and second air current measurement modules based on at least one of an operational status of a switch installed in the apparatus, an ambient temperature of the apparatus, and a rotational speed of the apparatus.

16. An apparatus for measuring air currents on a surface of a substrate, comprising:
   a first air current measurement module measuring a magnitude of air currents on a surface of a first substrate, which is processed in accordance with a semiconductor manufacturing process;
   a second air current measurement module measuring a movement direction of the air currents; and
   a power module supplying power to the first and second air current measurement modules,
   wherein
   the apparatus further comprises at least one of a memory module, which stores measurement results regarding the air currents, and a communication module, which transmits the measurement results regarding the air currents to outside,
   the first air current measurement module, the second air current measurement module, the power module, the memory module, and the communication module are mounted on a second substrate, which has the same shape as the first substrate,
   the second air current measurement module calculates the movement direction of the air currents using multiple first air current measurement modules,
   the first air current measurement module is disposed at a top of the second substrate, the second air current measurement module, the power module, the memory module, and the communication module are disposed at a bottom of the second substrate, the first air current measurement module is a thermal transducer, the first air current measurement module is formed on a surface of the second substrate as a thin film pattern or as a micro-electro mechanical system (MEMS) pattern, the first air current measurement module is disposed in a hole formed in the second substrate, the second air current measurement module, the power module, the memory module, and the communication module are embedded at the bottom of the second substrate or are installed on a third substrate, which is coupled to the bottom of the second substrate, and the apparatus is fastened within a first substrate processing device performing a cleaning process on the first substrate or within a second substrate processing device performing a heat treatment process on the first substrate, using multiple edge rings, which are installed at the bottom of the second substrate.

17. A method of measuring air currents on a surface of a substrate, comprising:

placing an apparatus for measuring air currents on a surface of a substrate at a location where a first sub-strate is positioned within a substrate processing device, which processes the first substrate in accordance with a semiconductor manufacturing process;

operating the apparatus and creating the same environment as when processing the first substrate within the substrate processing device;

measuring a magnitude and movement direction of air currents using the apparatus;

storing measurement results regarding the air currents; and transmitting the measurement results regarding the air currents to a designated terminal, wherein the apparatus is installed on a second substrate, which has the same shape as the first substrate.

18. The method of claim 17, wherein the substrate processing device is a first device performing a cleaning process on the first substrate or a second device performing a heat treatment process on the first substrate.

19. The method of claim 18, wherein if the substrate processing device is the first device, the apparatus is fastened on a spin chuck, which rotates the first substrate.

20. The method of claim 18, wherein if the substrate processing device is the second device, the apparatus is fastened on a plate of a unit that heat-treats the first substrate.

* * * * *